(12) United States Patent
Flotta et al.

(10) Patent No.: US 9,887,146 B2
(45) Date of Patent: Feb. 6, 2018

(54) METHOD AND APPARATUS FOR CHIP COOLING

(71) Applicant: International Business Machines Corporation, Armonk, NY (US)

(72) Inventors: Matteo Flotta, Armonk, NY (US); Yves C. Martin, Ossining, NY (US); Lubomyr T. Romankiw, Briarcliff Manor, NY (US); Theodore G. van Kessel, Millbrook, NY (US)

(73) Assignee: International Business Machines Corporation, Armonk, NY (US)

(*) Notice: Subject to any disclaimer, the term of this patent is extended or adjusted under 35 U.S.C. 154(b) by 295 days.

(21) Appl. No.: 14/611,684

(22) Filed: Feb. 2, 2015

(65) Prior Publication Data

US 2015/0208555 A1 Jul. 23, 2015

Related U.S. Application Data

(63) Continuation of application No. 12/128,290, filed on May 28, 2008, now Pat. No. 8,944,151.

(51) Int. Cl.
*H01L 23/473* (2006.01)
*H05K 7/20* (2006.01)

(52) U.S. Cl.
CPC ..... *H01L 23/4735* (2013.01); *H05K 7/20327* (2013.01); *H05K 7/20381* (2013.01); *H05K 7/20772* (2013.01); *H01L 2924/0002* (2013.01)

(58) Field of Classification Search
CPC ............ H05K 7/20809; H05K 7/20327; H01L 23/4735; H01L 23/4336
USPC .............................. 165/80.4, 104.33; 62/52.1
See application file for complete search history.

(56) References Cited

U.S. PATENT DOCUMENTS

| | | | |
|---|---|---|---|
| 3,064,448 A | 11/1962 | Whittington | |
| 4,417,295 A * | 11/1983 | Stuckert | H05K 7/20 165/123 |
| 5,021,924 A | 6/1991 | Kieda et al. | |
| 5,063,476 A * | 11/1991 | Hamadah | H01L 23/467 257/E23.099 |
| 5,220,804 A | 6/1993 | Tilton et al. | |
| 5,265,670 A | 11/1993 | Zingher | |
| 5,335,503 A | 8/1994 | Lee | |
| 5,349,831 A | 9/1994 | Dikoku et al. | |
| 5,435,379 A | 7/1995 | Moslehi et al. | |
| 5,471,850 A | 12/1995 | Cowans | |
| 5,689,968 A | 11/1997 | Frustaci et al. | |
| 6,083,380 A | 4/2000 | Selby et al. | |
| 6,104,610 A * | 8/2000 | Tilton | H01L 23/4735 165/104.33 |
| 6,105,373 A | 8/2000 | Watanabe et al. | |

(Continued)

FOREIGN PATENT DOCUMENTS

GB 2211662 A * 7/1989 ........... H01L 23/467

*Primary Examiner* — Devon Russell
(74) *Attorney, Agent, or Firm* — Louis Percello (57) ABSTRACT

In one embodiment, the invention is a method and apparatus for chip cooling. One embodiment of an apparatus for cooling a heat-generating device includes an inlet for receiving a fluid, a manifold comprising a plurality of apertures formed therein for decreasing the pressure of the fluid from a first pressure by adiabatic expansion for impinging the fluid on the heat-generating device once the pressure of the fluid is decreased from the first pressure.

19 Claims, 11 Drawing Sheets

(56) References Cited

U.S. PATENT DOCUMENTS

| | | | |
|---|---|---|---|
| 6,108,201 A | 8/2000 | Tilton et al. | |
| 6,154,368 A * | 11/2000 | Scofield | H01L 23/467 |
| | | | 165/80.3 |
| 6,550,263 B2 | 4/2003 | Patel et al. | |
| 6,603,658 B2 * | 8/2003 | Manno | H05K 7/20145 |
| | | | 165/908 |
| 6,952,346 B2 | 10/2005 | Tilton et al. | |
| 6,971,441 B2 | 12/2005 | Lee | |
| 7,391,612 B2 * | 6/2008 | Foster, Sr. | H01L 23/467 |
| | | | 165/104.21 |
| 7,477,516 B2 * | 1/2009 | Joshi | H01L 23/467 |
| | | | 165/80.3 |
| 7,602,608 B2 | 10/2009 | Tilton et al. | |
| 7,802,442 B2 * | 9/2010 | Bezama | H01L 23/4735 |
| | | | 62/259.2 |
| 7,808,780 B2 | 10/2010 | Brunschwiler et al. | |
| 8,174,828 B2 * | 5/2012 | Tilton | H01L 23/427 |
| | | | 165/104.33 |
| 8,194,406 B2 * | 6/2012 | Campbell | H05K 7/20827 |
| | | | 165/104.33 |
| 8,347,952 B2 * | 1/2013 | Ali | G06F 1/203 |
| | | | 165/122 |
| 8,376,031 B2 * | 2/2013 | Yang | F28F 3/02 |
| | | | 165/104.34 |
| 2002/0163782 A1 | 11/2002 | Cole et al. | |
| 2004/0123975 A1 | 7/2004 | Lee | |
| 2005/0185378 A1 * | 8/2005 | Tilton | H05K 7/20345 |
| | | | 361/699 |
| 2014/0070020 A1 * | 3/2014 | Malas | B21B 27/10 |
| | | | 239/13 |

* cited by examiner

METHOD AND APPARATUS FOR CHIP COOLING

BACKGROUND OF THE INVENTION

The present invention relates generally to high-powered computer chips, and relates more particularly to a novel system and approach for cooling computer chips.

The evolution toward high-powered computer chips has driven the design of heat sinks to cool the chips. Conventional heat sinks for cooling computer chips typically use fans to force air flow or use liquid cooling systems or refrigerators attached to a heat exchanger placed in intimate contact with the chip. Forced air systems become increasingly difficult to apply as chip power density increases (e.g., especially beyond 100+W/cm$^2$). Moreover, typical fans occupy as much as 0.3 to 0.5 of the volume of a typical computer blade (i.e., a self-contained computer server designed for high density) and are not capable of providing a flow of air that is fast enough to result in efficient cooling. Liquid cooling systems perform better in the case of high power density situations; however, they involve the risk of possible water leaks that can completely burn up the main processing chip and can seriously damage the other components in an electronic system.

Thus, there is a need in the art for an efficient and low-risk method and apparatus for chip cooling which at the same time permits a reduced computer blade volume.

SUMMARY OF THE INVENTION

In one embodiment, the invention is a method and apparatus for chip cooling. One embodiment of an apparatus for cooling a heat-generating device includes an inlet for receiving a fluid and a manifold or barrier for producing a sudden decrease in the pressure of the fluid and for expanding the fluid through a plurality of micro-apertures in the manifold (or barrier). The micro-apertures are arranged to allow highly compressed fluid to expand and to impinge at high-speed on the heat-generating device once the pressure of the fluid is decreased. Through adiabatic expansion cooling, a tremendous increase in volume and resultant extremely high velocity of the adiabatically cooled fluid is achieved. The cooled fluid flows at extremely high velocity past a metal fin-equipped surface in contact with the chip.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only a few possible typical embodiments of this invention and are therefore not to be considered limiting of its scope, for the invention may admit to other equally effective embodiments.

DETAILED DESCRIPTION

In one embodiment, the present invention is a method and apparatus for chip cooling. Although the invention is described within the context of cooling a computer chip, it will be appreciated that embodiments of the invention may be applied to cool any kind of heat-generating device, including laser devices. Embodiments of the present invention achieve high cooling densities by expanding a fluid (e.g., air, compressed nitrogen, helium, liquid nitrogen, or the like) from a very high pressure to a very low pressure through adiabatic expansion. More specifically, some embodiments of the present invention conduct high-pressure fluid through a channel to a heat exchanger that is in thermal contact with a heat generating device (e.g., a computer chip or a laser device) and a computer blade loaded with various components, in order to take advantage of the greatly decreased fluid density, increased rate of motion, turbulence and expansion cooling. In further embodiments, fluid expanded in the heat exchanger by adiabatic expansion is used to cool downstream, low-grade heat generating devices (e.g., other components of an electronic system incorporating a computer chip).

Figure 1:
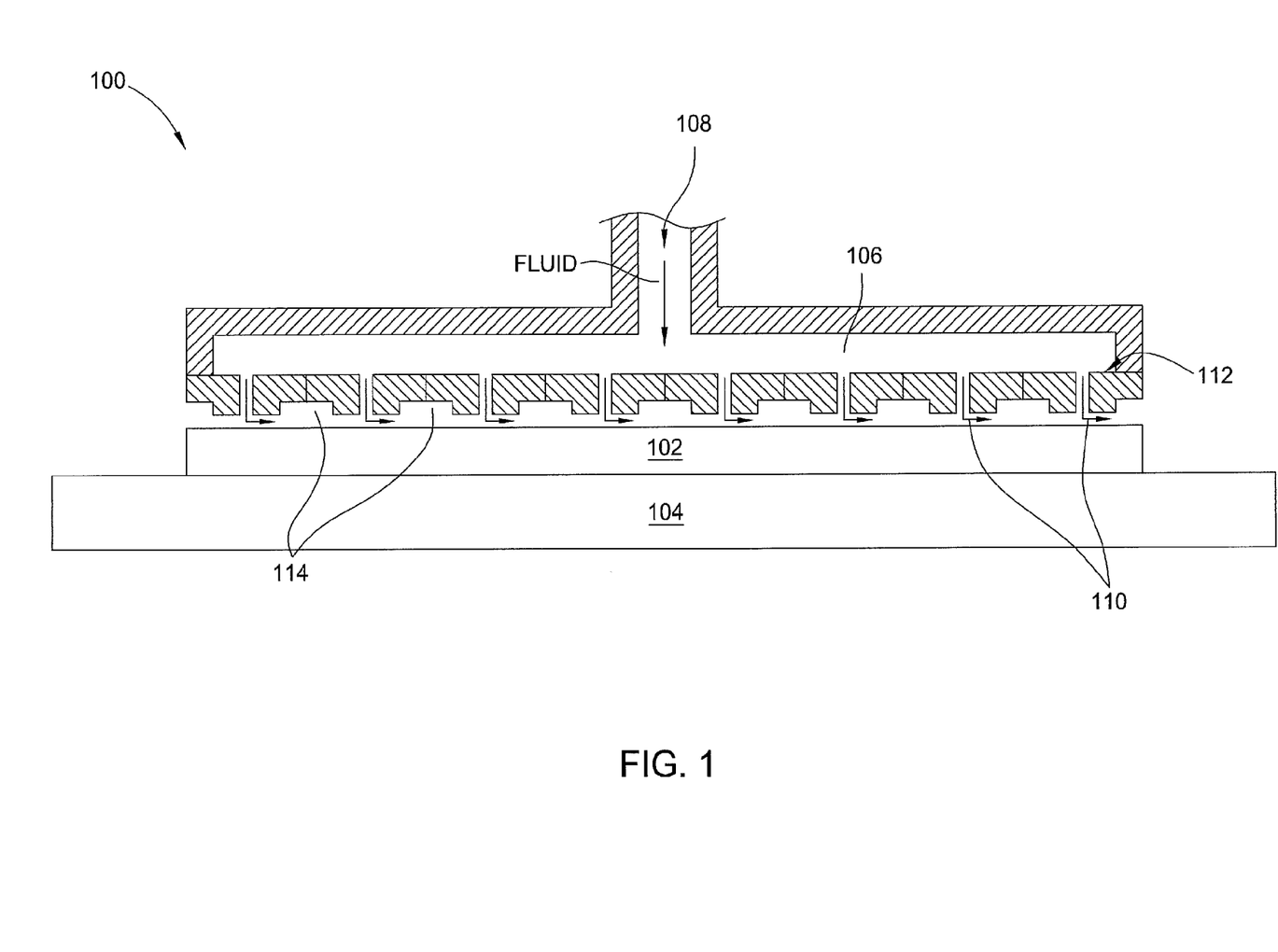
FIG. 1 is a schematic diagram illustrating a cross-sectional view of a first embodiment of a cooling system, according to the present invention.

FIG. 1 is a schematic diagram illustrating a cross-sectional view of a first embodiment of a cooling system 100, according to the present invention. The cooling system 100 is utilized to cool a heat-generating device 102 (such as a computer chip).

The cooling system 100 comprises a manifold 106 having an inlet 108 and a plurality of apertures 110. The inlet 108 is configured for coupling to a fluid supply, such as a hose or a pipe (not shown). The apertures 110 are formed in a surface 112 of the manifold 106. In one embodiment, the apertures 110 each have a diameter of approximately 0.4 mm and are spaced from each other by approximately 1.95 mm. Further, a plurality of grooves 114 are formed on an exterior of this surface 112. In one embodiment, the grooves 114 are approximately 1.5 mm wide and approximately 1.65 mm deep, and are formed between each pair of apertures 110. The grooves 114 duct the expanded fluid past the surface of the heat generating device 102 and out to the periphery of the heat generating device 102.

Figure 9:
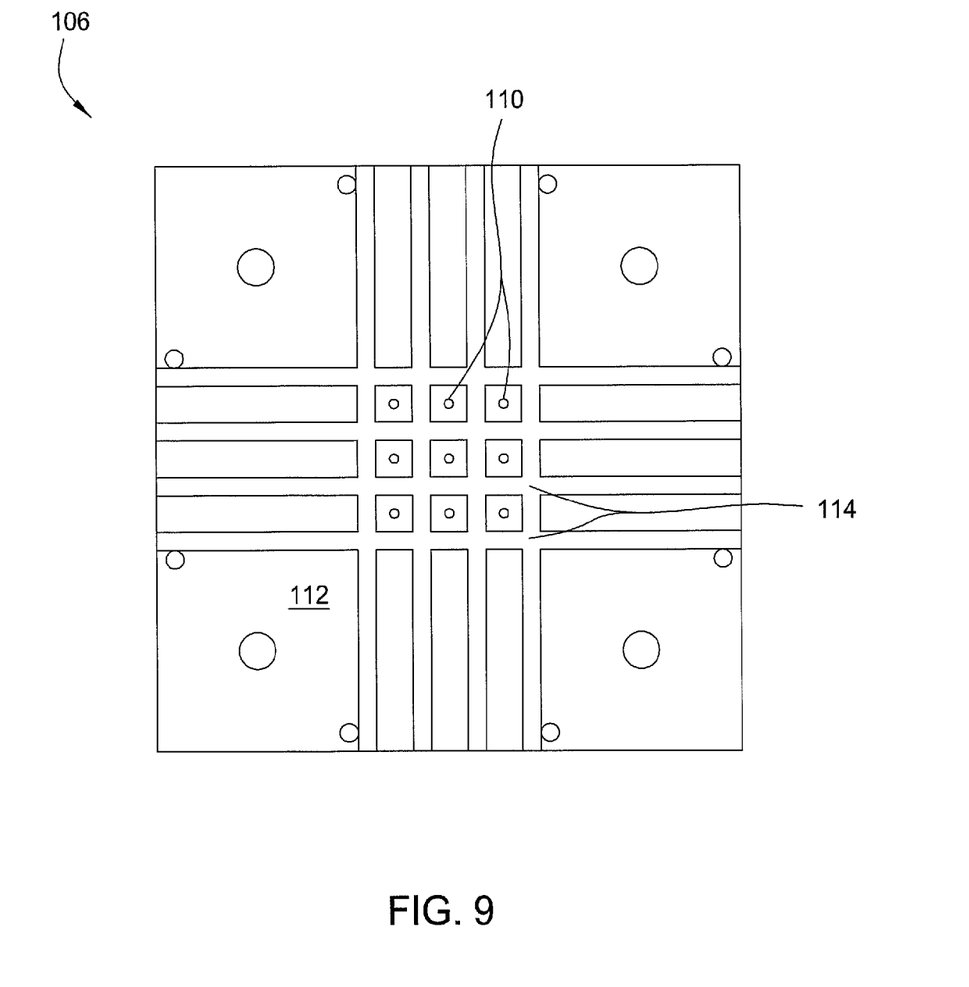
FIG. 9 is a plan view of a first embodiment of a manifold, with a 3×3 square array of apertures.
Figure 10A:
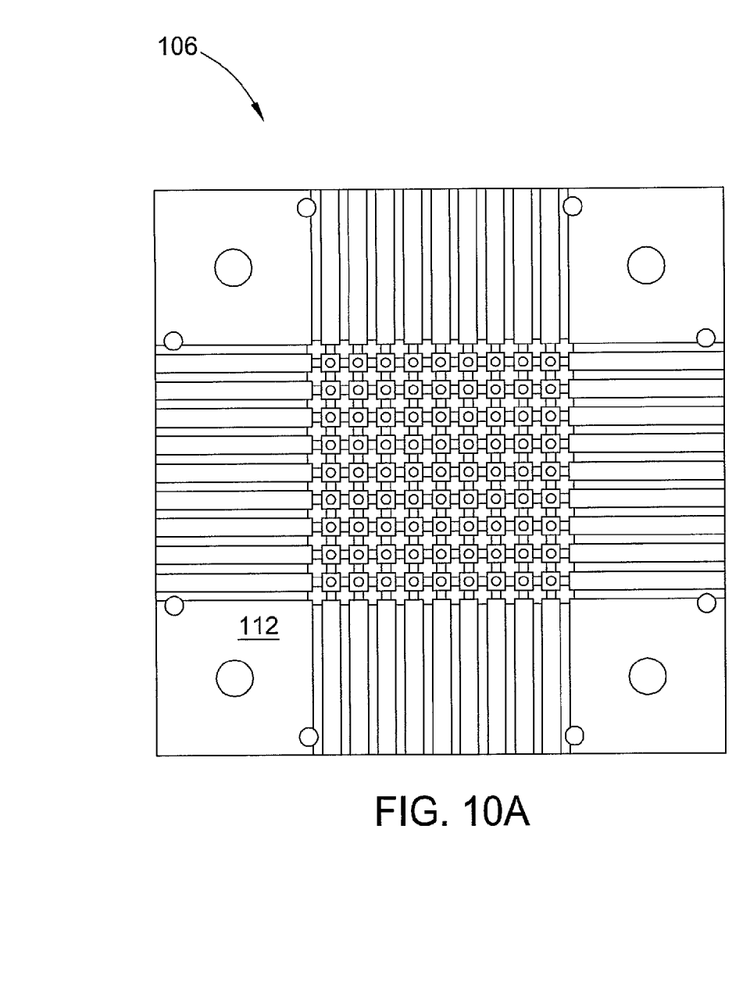
FIGS. 10A-10B illustrate a plan view of a second embodiment of the manifold, with a 9×9 square array of apertures.
Figure 10B:
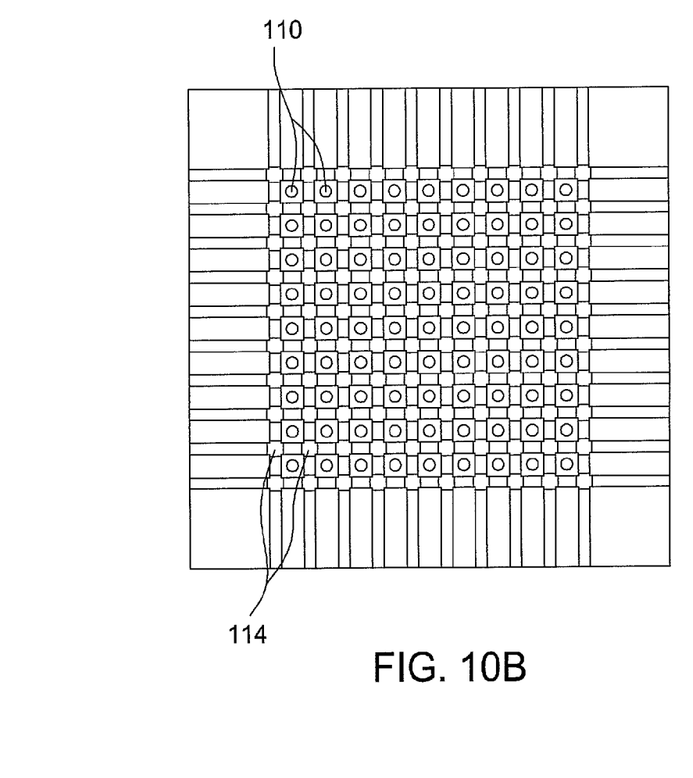
Figure 11A:
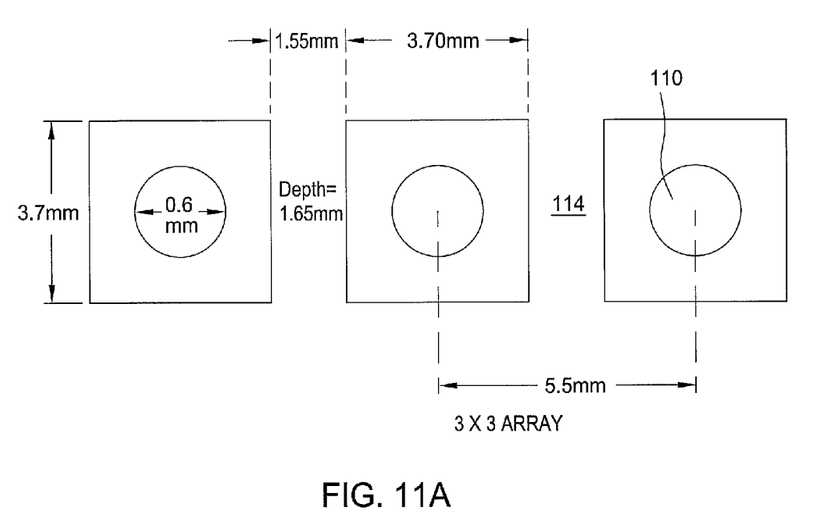
FIG. 11A is a schematic diagram illustrating the dimensions of a 3×3 array.
Figure 11B:
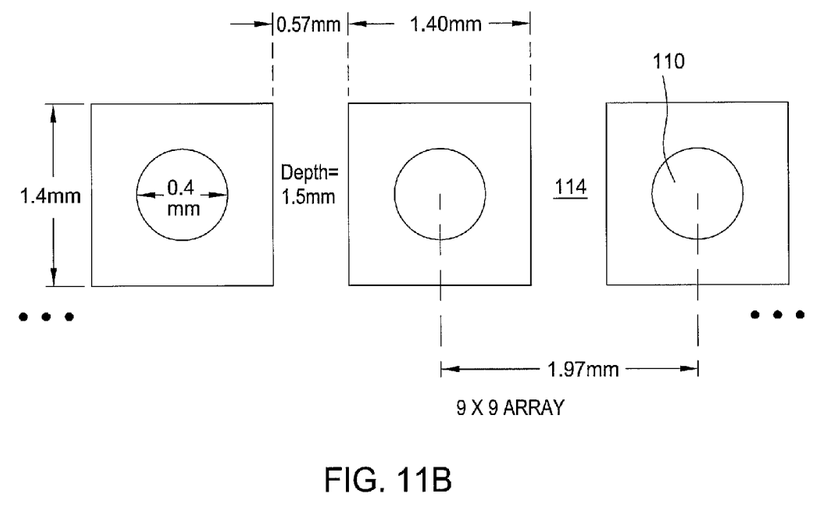
FIG. 11B is a schematic diagram illustrating the dimensions of a 9×9 array.

In one embodiment, the apertures 110 are laid out on the surface 112 of the manifold 106 in a square array. FIG. 9, for example, is a plan view of a first embodiment of the manifold 106, with a 3×3 square array of apertures 110. FIGS. 10A-10B, by contrast, illustrate a plan view of a second embodiment of the manifold 106, with a 9×9 square array of apertures 110. The dimensions of the array of apertures 110 will vary depending on whether the array is 3×3 or 9×9. For instance, FIG. 11A is a schematic diagram illustrating the dimensions of a 3×3 array; FIG. 11B is a schematic diagram illustrating the dimensions of a 9×9 array.

In operation, the cooling system 100 is positioned in proximity to the heat-generating device 102, which may reside on a substrate 104. The cooling system 100 is positioned such that the grooves 114 form channels between the cooling system 100 and the heat-generating device 102. Compressed, high-pressure fluid (e.g., liquid, gas, or a vaporized liquid that has been converted to gas) is supplied to the manifold 106 via the inlet 108. In one embodiment, "high-pressure" fluid is considered to be any fluid whose fluid pressure is between approximately fifty and 250 psi. The apertures 110 act as jets, allowing the fluid to escape, tremendously expanded in volume, and impinge at an extremely high speed on the surface of the heat-generating device 102. In one embodiment, a "high-speed" is considered to range from speeds in meters per second to speeds in excess of mach one. A pressure differential exists between the manifold 106 and the heat generating device 102. The pressure differential may decrease from approximately 250 psi down to as low as approximately atmospheric pressure (i.e., 14.6 psi).

The impinged fluid is warmed as it rushes, at an extremely high speed and low pressure (e.g., approximately atmospheric to approximately 22 psi), by the heat-generating device 102, leaving an extremely thin diffusion layer over which heat can be extremely effectively removed from the heat-generating device 102. Adiabatic expansion of the fluid in the jets (and resultant decrease in fluid pressure) enhances this cooling effect. Additionally, once the fluid impinges on the heat-generating device 102, the partially warmed fluid escapes to the periphery of the cooling system 100 via the channels created by the grooves 114.

In one embodiment, the size and location of the apertures 110 are pre-calculated in a manner to maximize expansion and velocity of the fluid at hot spots where the anticipated highest temperature(s) of the heat-generating device are expected to occur.

In one embodiment, the fluid is a substantially non-toxic fluid. In another embodiment, the fluid is a non-toxic liquid that can be easily expanded by evaporation to a gas and then easily removed and recompressed into a liquid.

Figure 2:
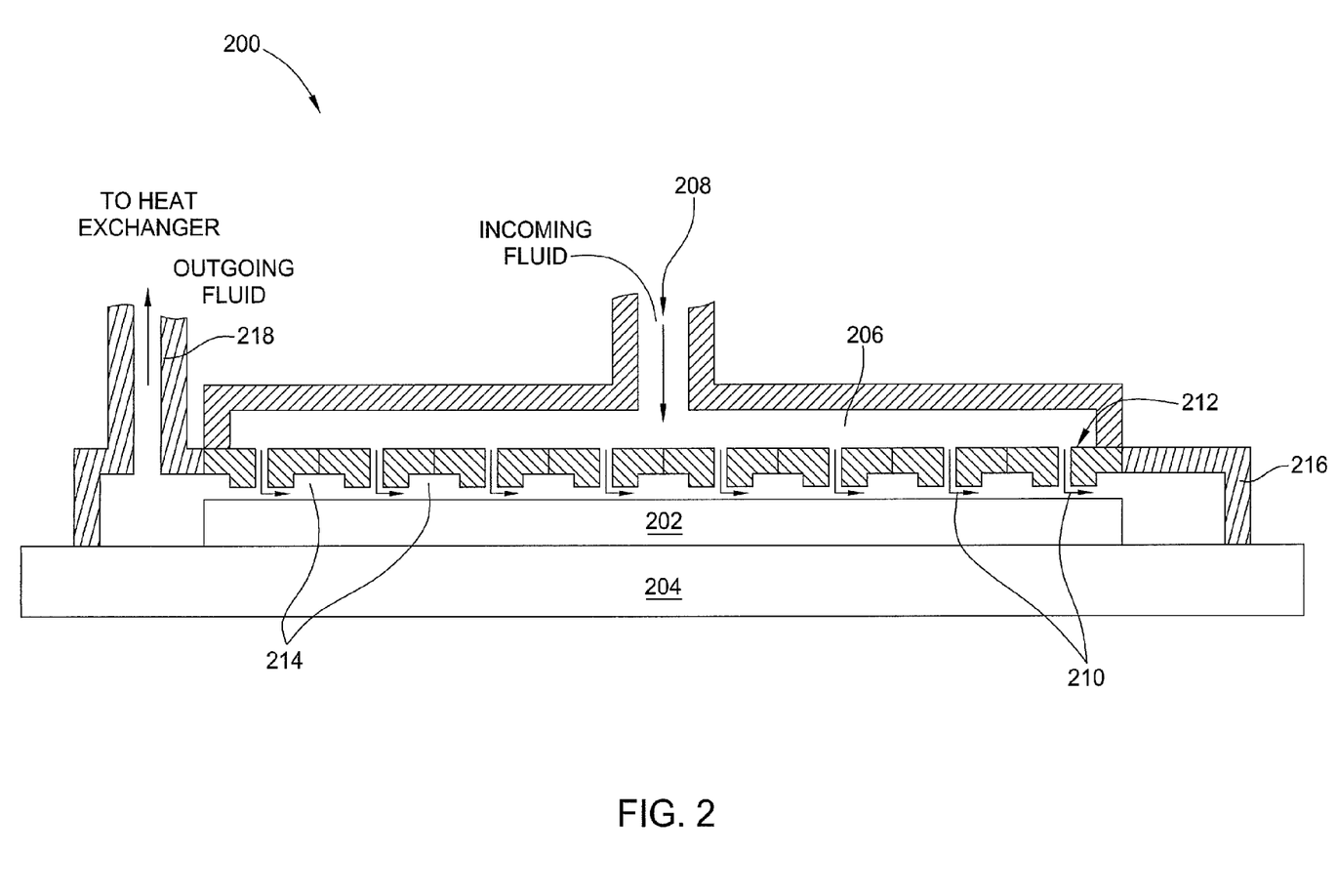
FIG. 2 is a schematic diagram illustrating a cross-sectional view of a second embodiment of a cooling system, according to the present invention.

FIG. 2 is a schematic diagram illustrating a cross-sectional view of a second embodiment of a cooling system 200, according to the present invention. Like the cooling system 100, the cooling system 200 is utilized to cool a heat-generating device 202 (such as a computer chip or a laser device).

Also like the cooling system 100, the cooling system 200 comprises a manifold 206 having an inlet 208 and a plurality of apertures 210. The inlet 208 is configured for coupling to a fluid supply, such as a hose or a pipe (not shown) connected to a high-pressure reservoir (e.g., vessel, cylinder, or compressor). The apertures 210 are formed in a surface 212 of the manifold 206. In one embodiment, the apertures 210 each have a diameter of approximately 0.4 mm and are spaced from each other by approximately 1.97 mm. In another embodiment, the apertures 210 each have a diameter of approximately 0.6 mm and are laid out on a square array on approximately 5.25 mm center spaces. Further, a plurality of grooves 214 are formed on an exterior of this surface 212. In one embodiment, a groove 214 is formed between each pair of apertures 210. In the embodiment where the apertures 210 are approximately 0.4 mm in diameter, the grooves 214 are approximately 0.57 mm wide and approximately 1.5 mm deep. In the embodiment where the apertures 210 are approximately 0.6 mm in diameter, the grooves 214 are approximately 1.55 mm wide and 1.65 mm deep. Thus, the manifold 206, including the apertures 210 and grooves 214, may be configured as illustrated in FIGS. 9-11.

In addition, the cooling system 200 further comprises a skirt 216 positioned around the perimeter of the manifold 206. The skirt 216 further comprises an outlet 218. In operation, the skirt 216 is positioned around the perimeter of the manifold 206 and contacts a substrate 204 or other surface on which the heat-generating device 202 resides. This creates an additional channel for flow of exiting fluid. In one embodiment, an interface between the skirt 216 and the substrate 204 is sealed (e.g., using a sealant or gasket material, such as silicone rubber or cement).

The cooling system 200 operates in much the same way as the cooling system 100. Compressed, high-pressure fluid (e.g., liquid or gas) is supplied to the manifold 206 via the inlet 208. In one embodiment, "high-pressure" fluid is considered to be a fluid whose pressure is above atmospheric (e.g., one to ten atmospheric range). This pressure is relative rather than absolute. The apertures 210 act as jets, allowing the fluid to escape and impinge on the surface of the heat-generating device 202. The impinged fluid is warmed as it rushes, at a high speed and low pressure (e.g., approximately atmospheric to approximately 22 psi), by the heat-generating device 202, providing a very high shear rate at the surface of the heat-generating device 202 and leaving an extremely thin boundary layer over which heat can be very efficiently removed from the heat-generating device 202. The thickness of the boundary layer is determined by the properties of the fluid (e.g., viscosity), the flow rate, and the flow channel. In one embodiment, the invention operates in a turbulent flow regime (i.e., Reynolds numbers above 2000). Whether laminar or turbulent, the boundary layer thickness is maintained relatively small (e.g., microns or less) so as not to impede heat transfer. The skirt 216 captures the fluid as the fluid exits the apertures 210. The exiting fluid is then removed from the cooling system 200 via the outlet 218. The skirt 216 and outlet 218 thus facilitate further removal of the impinged/warmed fluid. The skirt 216 is connected to a duct that leads the fluid away from the heat-generating device 202 and over other on-board components in a computer blade (i.e., a self-contained computer server) in which the heat-generating device 202 may be implemented.

In one embodiment, the impinged/warmed fluid is removed to an external environment (e.g., outside the general vicinity of the heat-generating device, outside a building housing the heat-generating device, etc.). In an alternative embodiment, the impinged/warmed fluid is removed, via the outlet 218, to an external heat exchanger (not shown) for removal of heat. In a further embodiment, the fluid is further provided to a compressor for re-compression of the fluid in a closed cycle.

Figure 3:
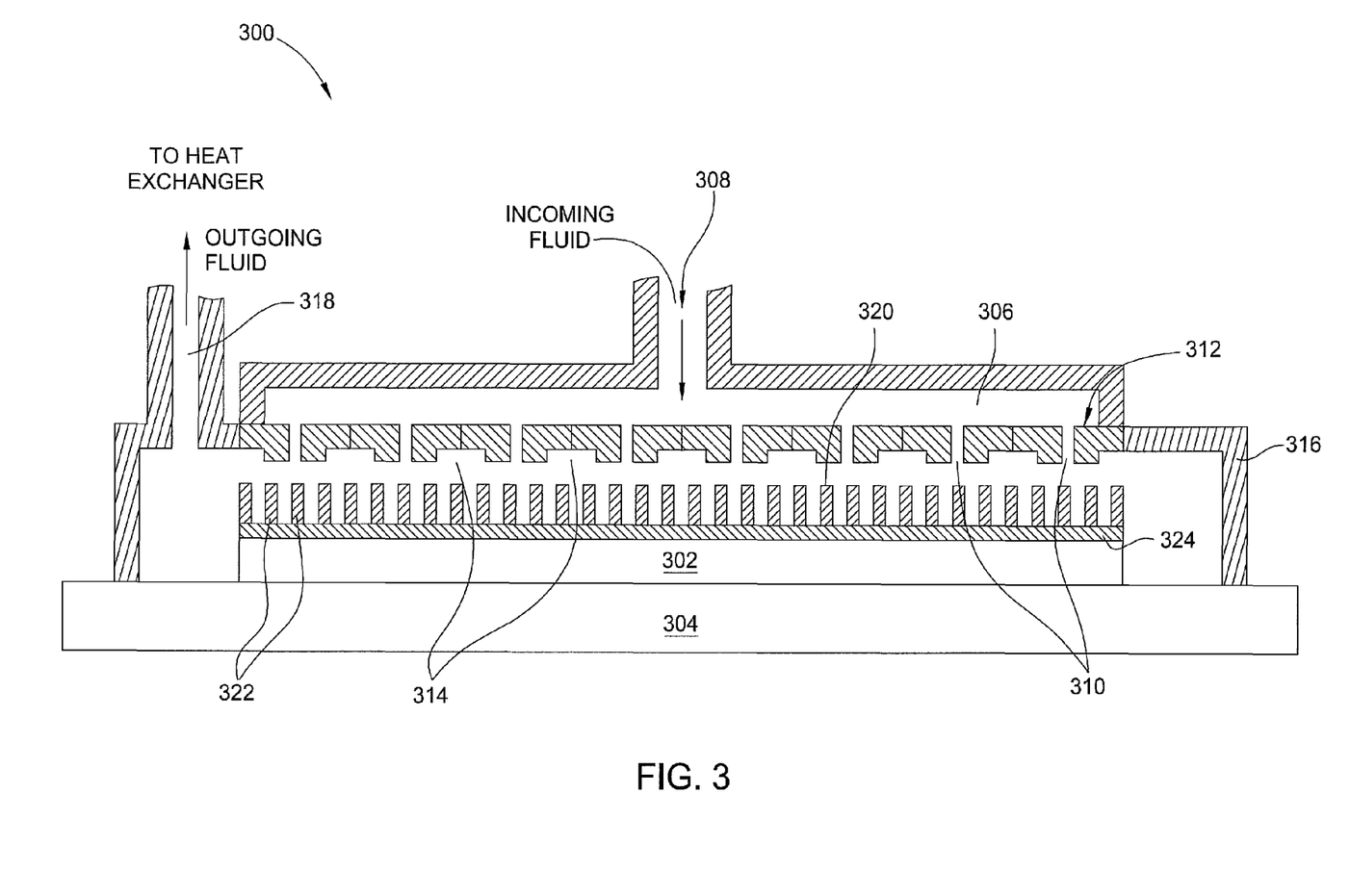
FIG. 3 is a schematic diagram illustrating a cross-sectional view of a third embodiment of a cooling system, according to the present invention.

FIG. 3 is a schematic diagram illustrating a cross-sectional view of a third embodiment of a cooling system 300, according to the present invention. Like the cooling systems 100 and 200, the cooling system 300 is utilized to cool a heat-generating device 302 (such as a computer chip).

Also like the cooling systems 100 and 200, the cooling system 300 comprises a manifold 306 having an inlet 308 and a plurality of apertures 310. The inlet 308 is configured for coupling to a fluid supply, such as a hose or a pipe (not shown). The apertures 310 are formed in a surface 312 of the manifold 306. In one embodiment, the apertures 310 each have a diameter of approximately 0.4 mm and are spaced from each other by approximately 1.97 mm. Further, a plurality of grooves 314 are formed on an exterior of this surface 312. In one embodiment, a groove 314 is formed between each pair of apertures 310. The manifold 306, including the apertures 310 and grooves 314, may be configured as illustrated in FIGS. 9-11.

In addition, the cooling system 300 further comprises a skirt 316 positioned around the perimeter of the manifold 306. The skirt 316 further comprises an outlet 318. In operation, the skirt 316 is positioned around the perimeter of the manifold 306 and contacts a substrate 304 or other surface on which the heat-generating device 302 resides. In one embodiment, an interface between the skirt 316 and the substrate 304 is sealed (e.g., using a sealant or gasket material, such as silicone rubber or cement).

The cooling system 300 further comprises an interposer plate 320 comprising a plurality of fins 322 positioned in thermal contact with the heat-generating device 302. In one embodiment, the fins 322 of the interposer plate 320 comprise at least one of: rectangular plates, circular or elliptical rods, cones, or other protrusions. In one embodiment, the interposer plate 320 is fabricated on the heat-generating device 302 (e.g., by texturing or micromachining a surface of the heat-generating device 302). In one embodiment, thermal contact between the interposer plate 320 and the heat-generating device 302 is enhanced using a thermal interface material 324 (e.g., at least one of: thermal grease, thermal adhesive, thermal cement, a solder thermal interface, or the like). In one embodiment, the interposer plate 320 is positioned between the heat-generating device and the manifold 306.

The cooling system 300 operates in much the same way as the cooling system 200. Compressed, high-pressure fluid (e.g., liquid or gas) is supplied to the manifold 306 via the inlet 308. The apertures 310 act as jets, allowing the fluid to escape, tremendously expanded in volume, and impinge at an extremely high speed onto the surface of the interposer plate 320 and fins 322 on the heat-generating device 302. The impinged, expanded (in volume) fluid is warmed as it rushes, at an extremely high speed and low pressure, by the interposer plate 320 and fins 322 on the heat-generating device 302, leaving an extremely thin boundary layer (formed substantially as discussed above) over which heat can be efficiently removed from the interposer plate 320 and fins 322 on the heat-generating device 302. The fins 322 of the interposer plate 320 provide a very large additional surface area from which the fluid expelled through the apertures 310 can remove heat, thereby greatly improving the efficiency of the cooling system 300. The skirt 316 captures fluid as the fluid exits the apertures 310, impinging on and being warmed by the heat-generating device 302. The exiting fluid is then removed from the cooling system 300 via the outlet 318.

In one embodiment, the impinged/warmed fluid is removed to an external environment (e.g., outside the general vicinity of the heat-generating device, outside a building housing the heat-generating device, etc.). In an alternative embodiment, the impinged/warmed fluid is removed, via the outlet 318, to an external heat exchanger (not shown) for removal of heat. In a further embodiment, the fluid is further provided to a compressor for re-compression of the fluid in a closed cycle. The fluid may be cooled after re-compression by a heat exchanger (not shown) for removal of heat.

Figure 4:
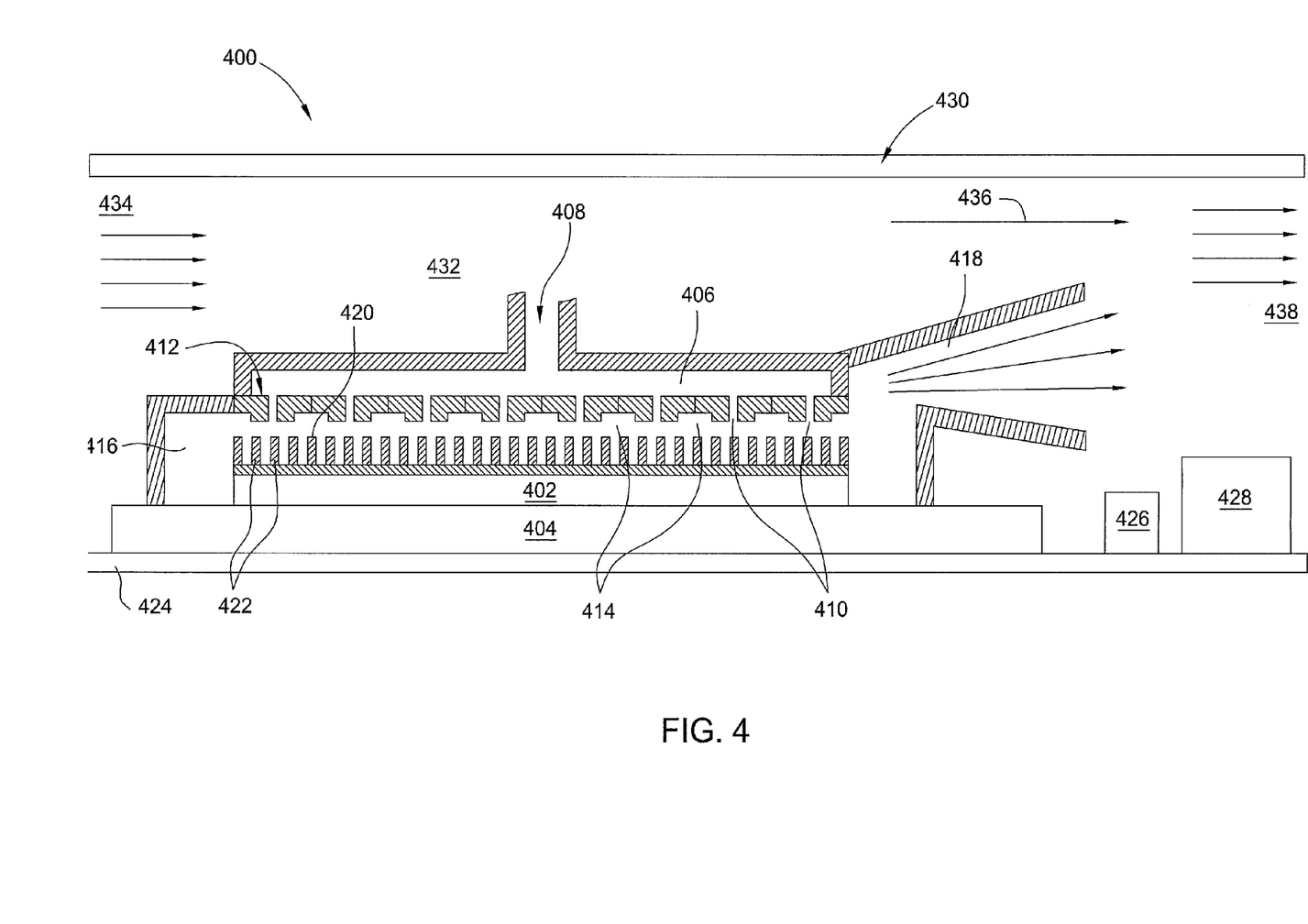
FIG. 4 is a schematic diagram illustrating a cross-sectional view of a fourth embodiment of a cooling system, according to the present invention.

FIG. 4 is a schematic diagram illustrating a cross-sectional view of a fourth embodiment of a cooling system 400, according to the present invention. Like the cooling systems 100, 200, and 300, the cooling system 400 is utilized to cool a heat-generating device 402 (such as a computer chip). Specifically, the cooling system 400 is illustrated as being deployed to cool a computer chip (i.e., heat-generating device 402) on a printed circuit board 424.

Also like the cooling systems 100, 200, and 300, the cooling system 400 comprises a manifold 406 having an inlet 408 and a plurality of apertures 410. The inlet 408 is configured for coupling to a fluid supply, such as a hose or a pipe (not shown). The apertures 410 are formed in a surface 412 of the manifold 406. In one embodiment, the apertures 410 each have a diameter of approximately 0.4 mm and are spaced from each other by approximately 1.97 mm. Further, a plurality of grooves 414 are formed on an exterior of this surface 412. In one embodiment, a groove 414 is formed between each pair of apertures 410. The manifold 406, including the apertures 410 and grooves 414, may be configured as illustrated in FIGS. 9-11.

In addition, the cooling system 400 further comprises a skirt 416 positioned around the perimeter of the manifold 406. The skirt 416 further comprises an outlet 418. In the embodiment illustrated in FIG. 4, the outlet 418 has a substantially conical shape. In another embodiment, the skirt 416 is connected to a duct positioned over other components of a blade or computer. In operation, the skirt 416 is positioned around the perimeter of the manifold 406 and contacts a substrate 404 or other surface on which the heat-generating device 402 resides. In one embodiment, an interface between the skirt 416 and the substrate 404 is sealed (e.g., using a sealant or gasket material, such as silicone rubber or cement).

In one embodiment, the cooling system 400 further comprises an interposer plate 420 comprising a plurality of fins 422 and positioned in thermal contact with the heat-generating device 402. In one embodiment, the fins 422 of the interposer plate 420 comprise at least one of: plates, rods, cones, or other protrusions. In one embodiment, the density of the fins 422 is highest at the point where the greatest heat dissipation is expected, in order to provide the largest surface area for heat exchange. In one embodiment, thermal contact between the interposer plate 420 and the heat-generating device 402 is enhanced using a thermal interface material (e.g., thermal grease or thermal adhesive). In one embodiment, the interposer plate 420 is positioned between the heat-generating device and the manifold 406.

The cooling system 400 operates in much the same way as the cooling system 300. Compressed, high-pressure fluid (e.g., liquid or gas) is supplied to the manifold 406 via the inlet 408. The apertures 410 act as jets, allowing the fluid to escape and impinge on the surface of the heat-generating device 402. The impinged fluid is warmed as it rushes, at a high speed and low pressure, by the heat-generating device 402, leaving an extremely thin boundary layer over (formed substantially as discussed above) which heat can be directly removed from the heat-generating device 402. The fins 422 of the interposer plate 420 provide additional surface area from which the fluid expelled through the apertures 410 can remove heat, thereby improving the efficiency of the cooling system 400. The skirt 416 captures fluid as the fluid exits the apertures 410, impinging on and being warmed by the heat-generating device 402. The exiting fluid is then removed from the cooling system 400 via the outlet 418. The substantially conical shape of the outlet 418 acts as a nozzle that allows the expanded, partly warmed exiting fluid to be ducted and directed over other components or low-grade heat sources in the blade (e.g., components 426 and 428 on the printed circuit board 424), providing additional cooling to these components. These other components also generate heat, but do not require as high a degree of cooling as the heat-generating device 402.

In a further embodiment, the cooling system 400 is deployed such that the outlet 418 is positioned within a duct or volume 432 that is at least partially enclosed by the printed circuit board 424 and a cover 430. In this embodiment, fluid exiting the outlet 418 impinges directly on the additional circuit components, positioned downstream relative to the heat-generating device 402. This embodiment also causes fluid to be drawn into the volume 432 upstream (relative to the heat-generating device 402), thereby enabling the cooling of upstream components. In one embodiment, the outlet 418 is shaped and positioned within the volume 432 to allow maximum fluid flow to low-power heat sources while simultaneously providing a muffler function to reduce exhaust noise. In another embodiment, the volume 432 is shaped to act as a muffler that suppresses noise from the rapid expansion, mixing, and high velocity of the fluid.

In particular, the suction created due to Venturi effect draws in cool air from the surrounding environment (e.g., outside a blade) through opening 434. The partially warmed fluid mixes with the cool air drawn in via the opening 434 within the volume 432 (e.g., illustrated by arrow 436). This mixture of air and partially warmed fluid provides cooling for the other components in the blade before the mixture exits the system 400 at opening 438.

In one embodiment, the impinged/warmed fluid is removed to an external environment (e.g., outside the general vicinity of the heat-generating device, outside a building housing the heat-generating device, etc.). In an alternative embodiment, the impinged/warmed fluid is removed, via the outlet 418, to an external heat exchanger (not shown) for removal of heat. In a further embodiment, the fluid is further provided to a compressor for re-compression of the fluid in a closed cycle.

Figure 5:
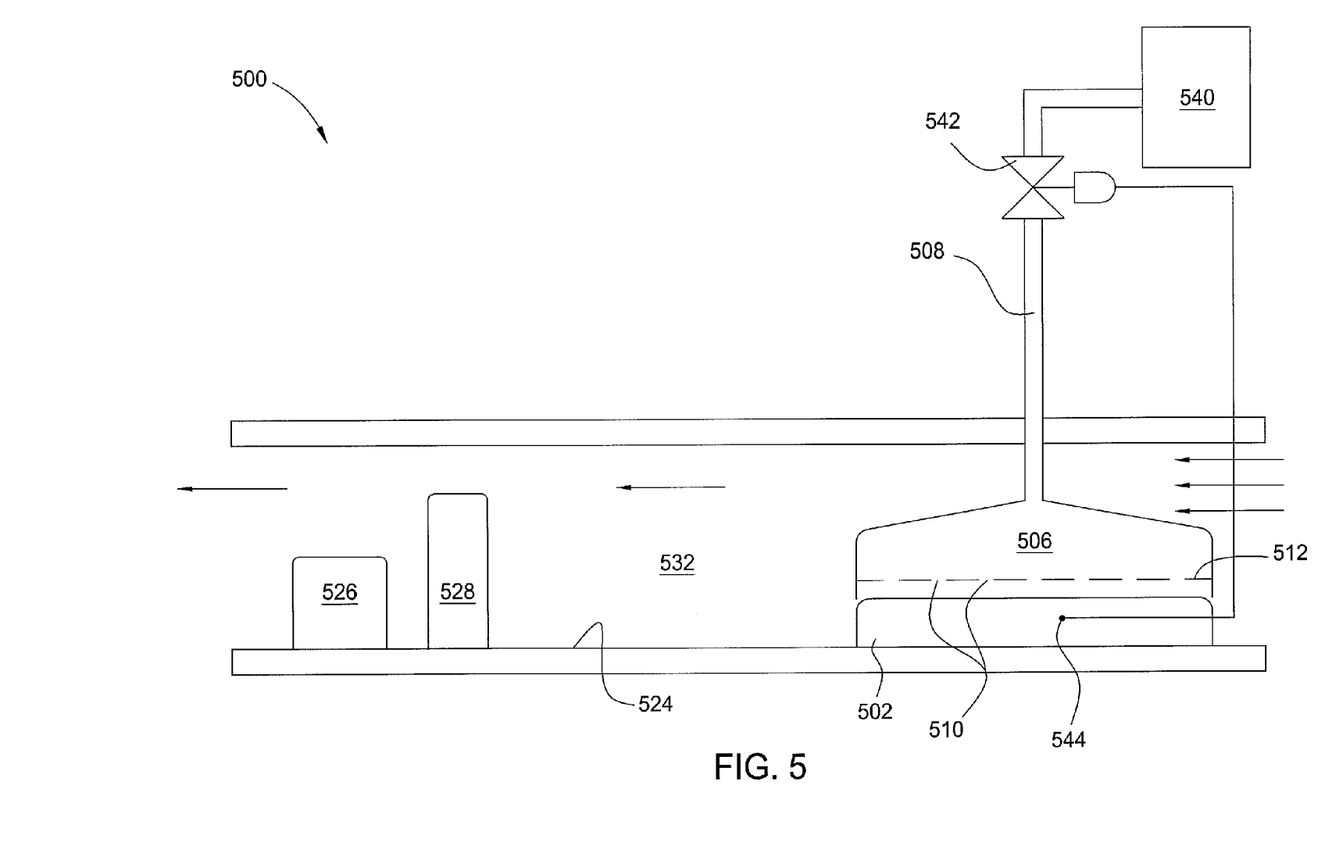
FIG. 5 is a schematic diagram illustrating a cross-sectional view of a fifth embodiment of a cooling system, according to the present invention.

FIG. 5 is a schematic diagram illustrating a cross-sectional view of a fifth embodiment of a cooling system 500, according to the present invention. Like the cooling systems 100, 200, 300, and 400, the cooling system 500 is utilized to cool a heat-generating device 502 (such as a computer chip). Specifically, the cooling system 500 is illustrated as being deployed to cool a computer chip (i.e., heat-generating device 502) on a printed circuit board 524.

Also like the cooling systems 100, 200, 300, and 400 the cooling system 500 comprises a manifold 506 having an inlet 508 and a plurality of apertures 510. The inlet 508 is configured for coupling to a high-pressure fluid supply 540, such as a hose, pipe, or reservoir. The supply of fluid is controlled by an automatic valve 542. The apertures 510 are formed in a surface 512 of the manifold 506. In one embodiment, grooves (not shown) are formed on an exterior of this surface 512. In one embodiment, a groove is formed between each pair of apertures 510. Embodiments of the cooling system 500 additionally comprise a skirt (not shown) such as those illustrated in previous embodiments. Thus, the manifold 506, including the apertures 510 and grooves, may be configured as illustrated in FIGS. 9-11.

In addition, the cooling system 500 comprises a voltage sensor (e.g., a thermocouple or diode) 544 coupled to the heat-generating device 502 and to the automatic valve 542 of the fluid supply 540 via a temperature controller (e.g., a computer controller feedback system) that, on demand, opens the valve and controls the rate of supply of fluid so that the temperature of the heat-generating device 502 does not exceed a maximum preset temperature. The portion of the voltage sensor 544 that is coupled to the heat-generating device 502 is specifically coupled to a portion of the heat-generating device 502 that is expected to heat to undesirably high temperatures in operation.

The cooling system 500 operates in much the same way as the cooling systems 300 and 400. Compressed, high-pressure fluid (e.g., liquid or gas) is supplied to the manifold 506 via the inlet 508. The apertures 510 act as jets, allowing the fluid to escape and impinge on the surface of the heat-generating device 502. The impinged fluid is warmed as it rushes, at a high speed and low pressure, by the heat-generating device 502, leaving an extremely thin boundary layer (formed substantially as discussed above) over which heat can be directly removed from the heat-generating device 502. The expanded, partly warmed exiting fluid flows through a duct 532 (which in some embodiments additionally functions as a muffler) and over other components or low-grade heat sources in the blade or other electronic device (e.g., components 526 and 528 on the printed circuit board 524), providing additional cooling to these components. These other components also generate heat, but do not require as high a degree of cooling as the heat-generating device 502.

In one embodiment, the impinged/warmed fluid is removed to an external environment (e.g., outside the general vicinity of the heat-generating device, outside a building housing the heat-generating device, etc.). In an alternative embodiment, the impinged/warmed fluid is removed to an external heat exchanger (not shown) for removal of heat. In a further embodiment, the fluid is further provided to a compressor for re-compression of the fluid in a closed cycle.

The voltage sensor 544 monitors the temperature of the heat-generating device 502, and controls opening of the valve 542 such that the supply of high-pressure fluid is adjusted to maintain a predefined steady state temperature for the heat-generating device. Fluid is thus provided "on demand" when necessary to maintain the steady state temperature of the heat-generating device 502 at a predetermined operating temperature.

Providing the fluid "on demand" greatly reduces the amount of fluid used by the system 500 (e.g., almost no fluid may be used when the heat-generating device 502 is not in operation). The use of the highly compressed fluid is thus greatly economized. Furthermore, by maintaining the temperature of the heat-generating device 502 at a predetermined temperature (or with only very small deviations from a mean temperature) prevents "spiking", which can cause very large fluctuations of the signal during switching (e.g., if the heat-generating device 502 is a semiconductor chip). Thus, large variations in signals as a result of large chip temperature variations are substantially reduced. This also minimizes local overheating of the heat-generating device 502, which often causes electromigration of the interconnect wiring metal and leads to premature chip failure.

Figure 6:
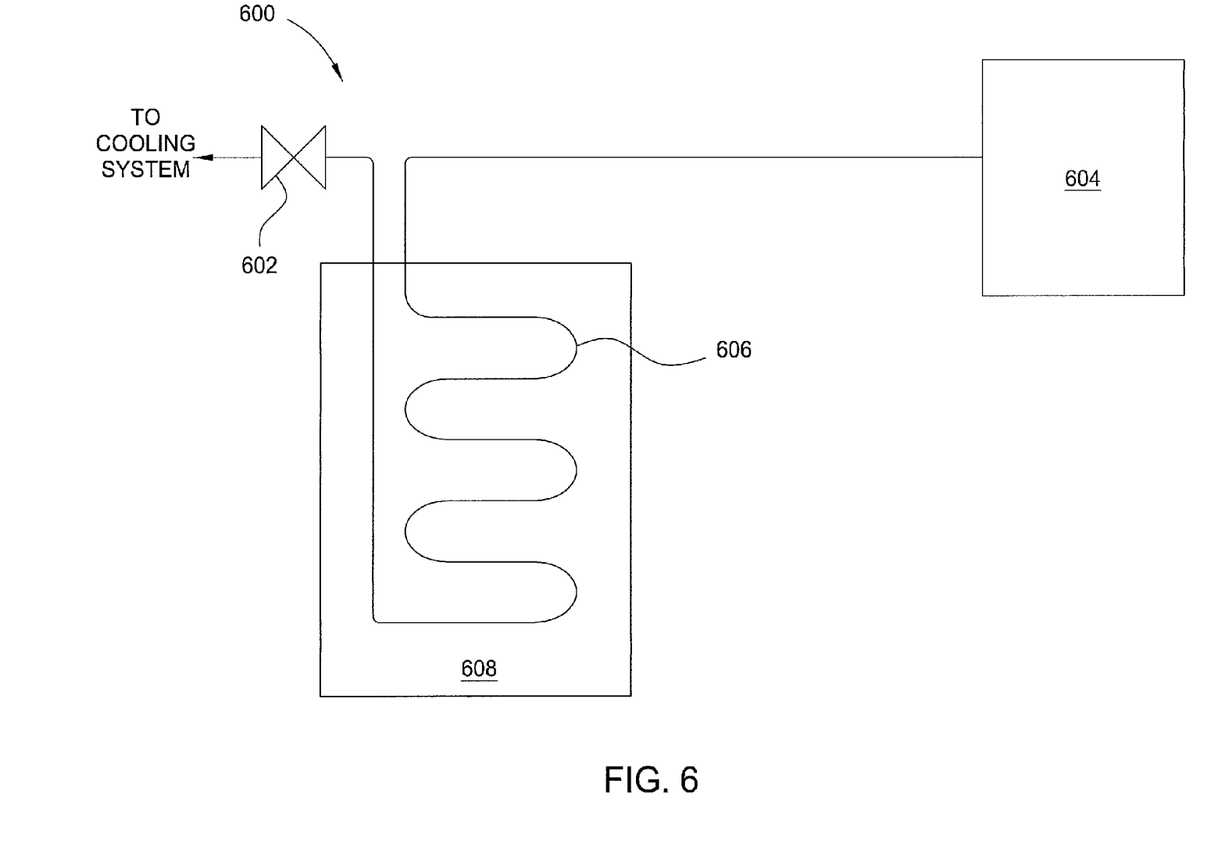
FIG. 6 is a schematic diagram illustrating a cross-sectional view of a further embodiment of a fluid pre-cooling and automatic control valve system, according to the present invention.

FIG. 6 is a schematic diagram illustrating a cross-sectional view of a further embodiment of a fluid pre-cooling and automatic control valve system 600, according to the present invention. The valve system 600 may be implemented, for example, in place of the valve 542 of the cooling system 500.

Specifically, the valve system 600 comprises a heat exchanger 606 disposed between the valve 602 and the fluid reservoir 604. In this way, the highly compressed fluid (e.g., in the range of approximately 50 psi to approximately 250 psi, and possibly in the range of approximately 70 psi to approximately 90 psi) contained in the reservoir 604 is passed through the heat exchanger 606 before being dispensed by the valve 602. In one embodiment, the heat exchanger 606, which comprises a metal pipe or tube, is immersed in a bath 608 of cold liquid nitrogen (or other liquefied gas such as nitrogen, oxygen, helium, or argon). In another embodiment, the heat exchanger is enclosed in a container of "dry ice" comprising carbon dioxide. This pre-cooling via liquid nitrogen or carbon dioxide lowers the temperature of the fluid and adds considerable additional cooling capacity to the fluid, allowing the fluid to remove substantially more heat from a heat-generating device and/or a blade. In an ultimate case, this permits a processor chip to operate at substantially room temperature, or even ultimately approaching liquid nitrogen temperature, thereby greatly improving the performance of the chip, lowering the power requirement, and increasing the useful life, of the processor by lowering the incidence of electromigration.

In one embodiment, a plurality of cooling systems (at least one of which is configured in accordance with one of the cooling systems 100, 200, 300, 400, or 500 discussed herein) are connected in series to enhance cooling. For example, fluid exiting from the outlet of a first cooling system may be directed to the inlet of a second cooling system.

Figure 7:
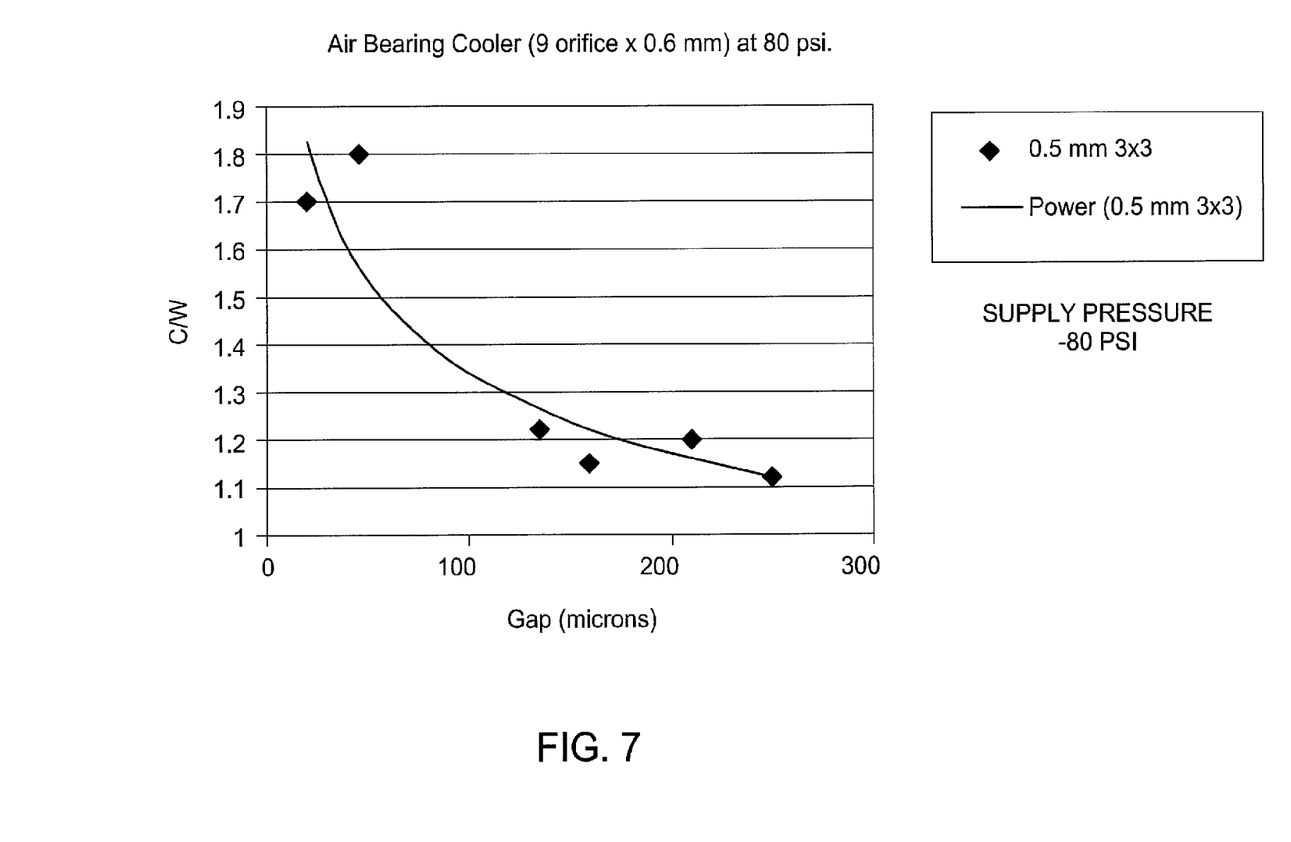
FIG. 7 is a graph illustrating experimental results taken from testing of a first cooling system constructed in accordance with the system illustrated in FIG. 4.
Figure 8:
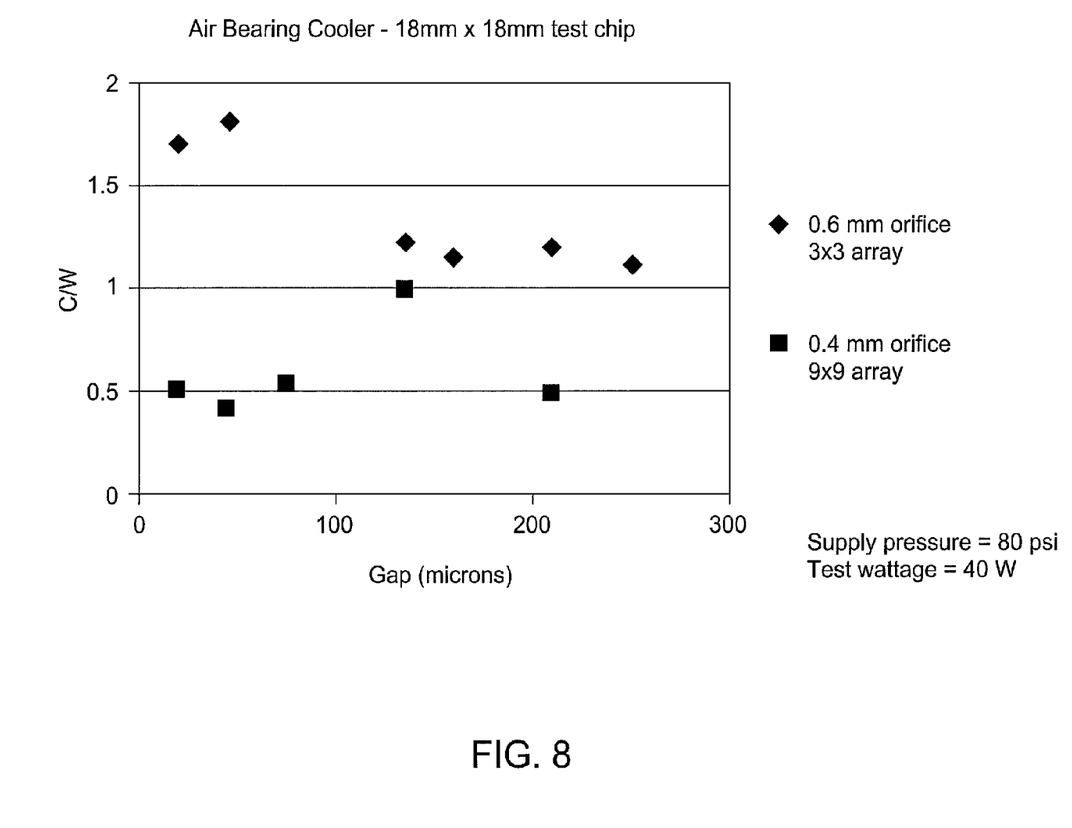
FIG. 8 is a graph illustrating experimental results taken from testing of a second cooling system constructed in accordance with the system illustrated in FIG. 1.

FIG. 7 is a graph illustrating experimental results taken from testing of a first cooling system constructed in accordance with the system illustrated in FIG. 4. FIG. 8 is a graph illustrating experimental results taken from testing of a second cooling system constructed in accordance with the system illustrated in FIG. 4. In the graph of FIG. 7, the spacing or gap between the apertures in the manifold and the chip was varied using a 3×3 aperture array. In the graph of FIG. 8, the spacing between apertures and the chip was varied using a 3×3 array and a 9×9 array. In both graphs, an 18×18 mm test chip was used as the heat-generating device to apply power for testing. The performance shown (measured in C/W) is consistent with efficient removal of heat from high power density chips at a fraction of the volume of a conventional vapor chamber heat sink.

In addition, Table 1, illustrated below, shows experimental results for a conventional copper micro-fin cooling system to which compressed air was supplied, much in the manner illustrated in FIG. 3 and FIG. 4. In the case of Table 1, the cooling system was further interfaced to the heat-generating device (test chip) using a liquid metal thermal interface. The compressed air was supplied at the pressures shown, and the performance of the cooling system was measured and reported in units of mm²C/W. Performance was measured by applying a known amount of power to the test chip and then measuring the temperature of the test chip, the temperature of the inlet air, and the pressure of the inlet air:

TABLE 1

| Pressure (psi) | Chip Temperature (° C.) | Watts | C-cm²/W |
|---|---|---|---|
| 20 | 83.0 | 90.0 | 0.66 |
| 30 | 73.5 | 87.6 | 0.57 |
| 40 | 67.1 | 85.8 | 0.51 |
| 40 | 83.7 | 118.2 | 0.51 |
| 50 | 85.1 | 142.2 | 0.43 |
| 60 | 84.7 | 150.0 | 0.40 |

The experimental data illustrated in FIGS. 7 and 8 and in Table 1 shows that at pressures of sixty psi, with a dense array of apertures (approximately 9×9), effective cooling can be achieved. Cooling is a result of both adiabatic expansion of the compressed air and air turbulence at the test chip, which greatly increases heat transfer.

Thus, the use of adiabatic expansion of highly compressed fluid (e.g., gas, air, liquid nitrogen, etc.), especially in combination with the ducting of the exhaust, substantially eliminates the need for typically bulky and inefficient fans, thus allowing the heat exchanger to be made at least one-third to one-fifth smaller. This frees up board space for additional components, such as a storage device. The use of compressed fluid does not introduce toxic gases to the system or to an outside environment to which the fluid is vented.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. An apparatus for cooling a heat generating device, the apparatus comprising:
   a liquid coolant;
   an inlet for receiving the liquid coolant;
   a manifold coupled to the inlet, the manifold having a plurality of apertures formed therein for impinging the liquid coolant on the heat-generating device;
   an outlet coupled to the manifold for removing a flow of the liquid coolant from the heat-generating device, wherein the outlet is directed towards at least one additional heat generating device; and
   a duct enclosing the liquid coolant, the inlet, the manifold, and the outlet, wherein the duct includes an opening that introduces a flow of air into the liquid coolant as the liquid coolant exits from the outlet, wherein the flow of air is unforced and originates from an environment that is external to the apparatus.

2. The apparatus of claim 1, wherein the manifold further comprises a plurality of grooves forming a corresponding plurality of channels between facing surfaces of the manifold and the heat generating device.

3. The apparatus of claim 2, wherein the plurality of channels is arranged to duct the liquid coolant to a periphery of the heat generating device.

4. The apparatus of claim 1, further comprising:
   a valve adapted for coupling to a supply of the liquid coolant and for controlling a provision of the liquid coolant from the supply to the manifold; and a voltage sensor for monitoring a temperature of the heat generating device, the voltage sensor being configured to control the valve such that an amount of the liquid coolant supplied to the manifold is sufficient to maintain a steady temperature on the heat generating device.

5. The apparatus of claim 4, further comprising:
a heat exchanger coupled between the valve and the supply of the liquid coolant, for lowering a temperature of the liquid coolant prior to the liquid coolant being provided to the manifold, wherein the heat exchanger comprises a pipe through which the liquid coolant passes, and the pipe is immersed in a cooling agent.

6. The apparatus of claim 1, further comprising:
an interposer plate configured for thermal coupling to the heat-generating device.

7. The apparatus of claim 6, wherein the interposer plate comprises a plurality of fins.

8. The apparatus of claim 6, further comprising a thermal interface material for enhancing thermal coupling of the interposer plate to the heat-generating device.

9. The apparatus of claim 8, wherein the thermal interface material comprises at least one of: thermal grease, thermal adhesive, thermal cement, or a solder thermal interface.

10. The apparatus of claim 1, wherein the liquid coolant is substantially non-toxic.

11. The apparatus of claim 1, wherein the liquid coolant is expandable into a gas for a removal from the apparatus and for recompression into a liquid after the removal.

12. The apparatus of claim 1, wherein the apparatus is coupled in series with at least one additional apparatus that is similarly configured.

13. The apparatus of claim 12, wherein a second outlet of the apparatus is coupled to an inlet of the at least one additional apparatus.

14. The apparatus of claim 1, wherein the opening employs suction to introduce the flow of air.

15. The apparatus of claim 1, wherein the flow of air is generated by non-motorized means.

16. The apparatus of claim 1, further comprising:
a skirt positioned around a perimeter of the manifold and coupled to the outlet.

17. A system comprising:
a printed circuit board including a plurality of heat-generating components;
a computer chip coupled to the printed circuit board; and
a cooling system positioned to cool at least the computer chip, the cooling system comprising:
 a liquid coolant;
 an inlet for receiving the liquid coolant;
 a manifold coupled to the inlet, the manifold having a plurality of apertures formed therein for impinging the liquid coolant on the computer chip;
 an outlet coupled to the manifold for removing a flow of the liquid coolant from the computer chip, wherein the outlet is directed towards at least one of the plurality of heat-generating components other than the computer chip; and
 a duct enclosing the liquid coolant, the inlet, the manifold, and the outlet, wherein the duct includes an opening that introduces a flow of air into the liquid coolant as the liquid coolant exits from the outlet, wherein the flow of air is unforced and originates from an environment that is external to the cooling system.

18. The system of claim 17, wherein the opening employs suction to introduce the flow of air.

19. The system of claim 17, wherein the flow of air is generated by non-motorized means.

* * * * *